United States Patent
Park (10) Patent No.: US 11,933,855 B2
(45) Date of Patent: Mar. 19, 2024

(54) APPARATUS FOR MEASURING IMPEDANCE OF FUEL CELL FOR VEHICLE AND METHOD THEREOF

(71) Applicants: HYUNDAI MOTOR COMPANY, Seoul (KR); Kia Corporation, Seoul (KR)

(72) Inventor: Gun Hyung Park, Seongnam-si (KR)

(73) Assignees: HYUNDAI MOTOR COMPANY, Seoul (KR); KIA CORPORATION, Seoul (KR)

(*) Notice: Subject to any disclaimer, the term of this patent is extended or adjusted under 35 U.S.C. 154(b) by 10 days.

(21) Appl. No.: 17/838,542

(22) Filed: Jun. 13, 2022

(65) Prior Publication Data

US 2023/0152382 A1 May 18, 2023

(30) Foreign Application Priority Data

Nov. 18, 2021 (KR) .......................... 10-2021-0159626

(51) Int. Cl.
*G01R 31/389* (2019.01)
*G01R 31/3842* (2019.01)
*H01M 8/04537* (2016.01)
*H01M 8/04746* (2016.01)
*H01M 8/04858* (2016.01)

(52) U.S. Cl.
CPC ....... *G01R 31/389* (2019.01); *G01R 31/3842* (2019.01); *H01M 8/04649* (2013.01); *H01M 8/04753* (2013.01); *H01M 8/0488* (2013.01); *H01M 2250/20* (2013.01)

(58) Field of Classification Search
None
See application file for complete search history.

(56) References Cited

U.S. PATENT DOCUMENTS

| | | | |
|---|---|---|---|
| 8,420,268 B2 | 4/2013 | Imamura et al. | |
| 10,249,895 B2 | 4/2019 | Won et al. | |
| 10,276,883 B2 | 4/2019 | Shiokawa et al. | |
| 11,228,049 B2 | 1/2022 | Park | |
| 2009/0226770 A1* | 9/2009 | Manabe | H01M 8/04947 429/431 |
| 2010/0081022 A1 | 4/2010 | Imamura et al. | |
| 2010/0151341 A1* | 6/2010 | Manabe | H01M 8/04089 429/431 |
| 2016/0141688 A1 | 5/2016 | Shiokawa et al. | |
| 2018/0108925 A1 | 4/2018 | Won et al. | |

(Continued)

FOREIGN PATENT DOCUMENTS

| | | | |
|---|---|---|---|
| KR | 10-1136500 B1 | 4/2012 | |
| KR | 10-1646854 B1 | 8/2016 | |

(Continued)

*Primary Examiner* — Jas A Sanghera
(74) *Attorney, Agent, or Firm* — MORGAN, LEWIS & BOCKIUS LLP (57) ABSTRACT

Disclosed are an apparatus for measuring an impedance of a fuel cell in a system to which a DC-DC converter is applied and a method thereof. The method includes calculating an impedance of a fuel cell stack based on an impedance of an output terminal of the fuel cell stack measured in a state in which the output of the fuel cell stack is drawn and the impedance of the output terminal of the fuel cell stack measured in a state in which the drawing of the output of the fuel cell stack is stopped.

20 Claims, 7 Drawing Sheets

```
APPARATUS FOR MEASURING
IMPEDANCE OF FUEL CELL FOR VEHICLE
100

IMPEDANCE                    CONTROLLER
MEASUREMENT DEVICE              120
110
```

(56) References Cited

U.S. PATENT DOCUMENTS

2018/0145350 A1* 5/2018 Matsumoto ....... H01M 8/04634
2020/0168930 A1* 5/2020 Park ........................ B60L 58/40
2021/0184236 A1 6/2021 Park

FOREIGN PATENT DOCUMENTS

| KR | 10-1829105 B1 | 2/2018 |
| KR | 10-1832685 B1 | 2/2018 |
| KR | 10-2018-0042235 A | 4/2018 |
| KR | 10-1866072 B1 | 6/2018 |
| KR | 10-1870520 B1 | 6/2018 |
| KR | 10-1887787 B1 | 8/2018 |
| KR | 10-2020-0060899 A | 6/2020 |
| KR | 10-2021-0074712 A | 6/2021 |

* cited by examiner

| VOLTAGE(V) | CURRENT(A) | Power(kW) | POSSIBLE OR IMPOSSIBLE |
|---|---|---|---|
| 400 | 5 | 2 | POSSIBLE |
| 380 | 20 | 7.6 | POSSIBLE |
| 360 | 70 | 25.2 | POSSIBLE |
| 350 | 85 | 29.75 | POSSIBLE |
| 340 | 90 | 30.6 | IMPOSSIBLE |
| 330 | 120 | 39.6 | IMPOSSIBLE |
| ... | ... | ... | ... |
| ... | ... | ... | ... |

APPARATUS FOR MEASURING IMPEDANCE OF FUEL CELL FOR VEHICLE AND METHOD THEREOF

CROSS-REFERENCE TO RELATED APPLICATION

This application claims the benefit of priority to Korean Patent Application No. 10-2021-0159626, filed in the Korean Intellectual Property Office on Nov. 18, 2021, the entire contents of which are incorporated herein by reference.

TECHNICAL FIELD

The present disclosure relates to an apparatus for measuring an impedance of a fuel cell for a vehicle and a method thereof, and more particularly, to an apparatus for measuring an impedance of a fuel cell in a system to which a DC-DC converter is applied and a method thereof.

BACKGROUND

Measurement of the impedance of a fuel cell applied to a vehicle is one of methods for determining the state of the fuel cell stack, and it is possible to determine the internal physical state of the fuel cell by measuring the impedance for each frequency band. By measuring the impedance in the high frequency region, the internal quantity of the fuel cell stack can be estimated, and by measuring the impedance in the low frequency region, it is possible to estimate the mass transfer loss characteristics in the cathode catalyst layer and the gas diffusion layer. In the intermediate frequency region, activation loss including hydrogen ion movement and electrochemical reaction characteristics in the porous catalyst layer may be estimated.

Accordingly, in a technology for determining the quantity of a fuel cell stack by measuring the impedance at a specific single frequency, there is a need to develop a technology for more accurately measuring the impedance of a fuel cell stack.

SUMMARY

The present disclosure has been made to solve the above-mentioned problems occurring in the prior art while advantages achieved by the prior art are maintained intact.

An aspect of the present disclosure provides an apparatus and method for measuring an impedance of a fuel cell in a system to which a DC-DC converter is applied.

Another aspect of the present disclosure provides an apparatus and method for measuring an impedance of a fuel cell for a vehicle, which can accurately measure the impedance of only a stack by removing the impedances of other components from the measured impedance.

Still another aspect of the present disclosure provides an apparatus and method for measuring an impedance of a fuel cell for a vehicle to accurately identify and analyze the internal state of the fuel cell by accurately measuring the impedance of only a fuel cell stack.

Still another aspect of the present disclosure provides an apparatus and method for measuring an impedance of a fuel cell for a vehicle that can accurately measure the impedance of only a fuel cell stack even if there are other components (an air compressor, a cooling pump, and the like) in addition to the fuel cell stack.

Still another aspect of the present disclosure provides an apparatus and method for measuring an impedance of a fuel cell for a vehicle that can accurately measure the impedance of a fuel cell stack in order to more accurately analyze the estimation of the quantity of the fuel cell stack, mass transfer loss characteristics, activation loss, and the like.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, an apparatus for measuring an impedance of a fuel cell for a vehicle may include an impedance measurement device that is provided in a fuel cell system to measure an impedance of an output terminal of a fuel cell stack and a controller. The fuel cell system may include a DC-DC converter configured to control voltages of a high voltage terminal which is connected to at least one of a motor and a peripheral device of the vehicle or a low voltage terminal which is connected to the fuel cell stack. The controller may draw an output of the fuel cell stack and stop drawing the output of the fuel cell stack when an impedance measurement request is received. The controller may measure the impedance of the output terminal of the fuel cell stack in a state in which the output of the fuel cell stack is drawn and measure the impedance of the output terminal of the fuel cell stack in a state in which the drawing of the output of the fuel cell stack is stopped, through the impedance measurement device, and calculate the impedance of the fuel cell stack based on the impedance of the output terminal of the fuel cell stack measured in the state in which the output of the fuel cell stack is drawn and the impedance of the output terminal of the fuel cell stack measured in the state in which the drawing of the output of the fuel cell stack is stopped.

According to an embodiment, the controller may measure the impedance of the output terminal of the fuel cell stack by identifying an amplitude and a phase difference of a response signal through the impedance measurement device after applying a minute AC signal for each frequency band to the low voltage terminal.

According to an embodiment, the controller may measure the impedance of the output terminal of the fuel cell stack through the impedance measurement device when the impedance measurement request is received and a state of charge (SoC) of a battery of the vehicle exceeds a reference value.

According to an embodiment, the controller may control supply of air to the fuel cell stack to draw the output of the fuel cell stack and stop drawing the output of the fuel cell stack.

According to an embodiment, the controller may control the DC-DC converter in a buck mode and measure the impedance of the output terminal of the fuel cell stack through the impedance measurement device when the impedance measurement request is received.

According to an embodiment, the controller may set the voltage of the low voltage terminal that is controlled to be constant in the state in which the output of the fuel cell stack is drawn and in the state in which the drawing of the output of the fuel cell stack is stopped.

According to an embodiment, the controller may control the DC-DC converter in a boost mode when power of the fuel cell stack is required to drive at least one of the motor of the vehicle or the peripheral device, and stop measuring the impedance of the output terminal of the fuel cell stack.

According to an embodiment, the controller may measure the impedance of the output terminal of the fuel cell stack through the impedance measurement device in the state in which the output of the fuel cell stack is drawn after adjusting the variable resistor connected to the low voltage terminal such that power consumed by a variable resistor is greater than power output from the fuel cell stack.

According to an embodiment, the controller may calculate power output from the DC-DC converter by subtracting power output from the fuel cell stack from the power consumed by the variable resistor in the state in which the output of the fuel cell stack is drawn.

According to an embodiment, the controller may measure the impedance of the output terminal of the fuel cell stack through the impedance measurement device after adjusting the variable resistor such that the power output from the DC-DC converter is equal to the power output from the DC-DC converter calculated in the state in which the output of the fuel cell stack is drawn, in the state in which the drawing of the output of the fuel cell stack is stopped.

According to an embodiment, the controller may adjust the variable resistor by calculating a resistance value of the variable resistor such that the power output from the DC-DC converter is equal to the power output from the DC-DC converter calculated in the state in which the output of the fuel cell stack is drawn, and drive a relay, disposed between the low voltage terminal and the variable resistor, to connect the low voltage terminal and the variable resistor.

According to an embodiment, the controller may maintain a control state of the peripheral device, and measure the impedance through the impedance measurement device in the state in which the output of the fuel cell stack is drawn and in the state in which the drawing of the output of the fuel cell stack is stopped.

According to an embodiment, the controller may change the voltage of the low voltage terminal to one or more values within a range in which the variable resistor connected to the low voltage terminal consumes the power output from the fuel cell stack, and measure the impedance through the impedance measurement device.

According to an embodiment, the controller may control the voltage of the low voltage terminal to be constant, and measure the impedance through the impedance measurement device in the state in which the output of the fuel cell stack is drawn and in the state in which the drawing of the output of the fuel cell stack is stopped.

According to another aspect of the present disclosure, a method of measuring an impedance of a fuel cell for a vehicle may include drawing, by a controller, an output of a fuel cell stack and stopping drawing the output of the fuel cell stack when an impedance measurement request is received, measuring, by the controller, an impedance of an output terminal of the fuel cell stack in a state in which the output of the fuel cell stack is drawn and measuring the impedance of the output terminal of the fuel cell stack in a state in which the drawing of the output of the fuel cell stack is stopped, through an impedance measurement device provided in a fuel cell system, wherein the fuel cell system includes a DC-DC converter configured to control voltages of a high voltage terminal which is connected to at least one of a motor or a peripheral device of the vehicle and a low voltage terminal which is connected to the fuel cell stack, and calculating, by the controller, the impedance of the fuel cell stack based on the impedance of the output terminal of the fuel cell stack measured in the state in which the output of the fuel cell stack is drawn and the impedance of the output terminal of the fuel cell stack measured in the state in which the drawing of the output of the fuel cell stack is stopped.

According to an embodiment, the measuring of the impedance by the controller may include measuring, by the controller, the impedance of the output terminal of the fuel cell stack through the impedance measurement device when the impedance measurement request is received and a state of charge (SoC) of a battery of the vehicle exceeds a reference value.

According to an embodiment, the measuring of the impedance by the controller may include controlling, by the controller, the DC-DC converter in a boost mode when power of the fuel cell stack is required to drive at least one of the motor of the vehicle or the peripheral device, and stopping measuring the impedance of the output terminal of the fuel cell stack.

According to an embodiment, the measuring of the impedance by the controller may include maintaining a control state of the peripheral device, and measuring the impedance through the impedance measurement device in the state in which the output of the fuel cell stack is drawn and in the state in which the drawing of the output of the fuel cell stack is stopped.

According to an embodiment, the measuring of the impedance by the controller may include changing, by the controller, the voltage of the low voltage terminal to one or more values within a range in which a variable resistor connected to the low voltage terminal consumes power output from the fuel cell stack, and measuring the impedance through the impedance measurement device.

According to an embodiment, the measuring of the impedance by the controller may include controlling the voltage of the low voltage terminal to be constant, and measuring the impedance through the impedance measurement device in the state in which the output of the fuel cell stack is drawn and in the state in which the drawing of the output of the fuel cell stack is stopped.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Hereinafter, some embodiments of the present disclosure will be described in detail with reference to the exemplary drawings. In adding the reference numerals to the components of each drawing, it should be noted that the identical or equivalent component is designated by the identical numeral even when they are displayed on other drawings. Further, in describing the embodiment of the present disclosure, a detailed description of the related known configuration or function will be omitted when it is determined that it interferes with the understanding of the embodiment of the present disclosure.

In describing the components of the embodiment according to the present disclosure, terms such as first, second, A, B, (a), (b), and the like may be used. These terms are merely intended to distinguish the components from other components, and the terms do not limit the nature, order or sequence of the components. Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described in detail with reference to FIGS. 1 to 7.

Figure 1:
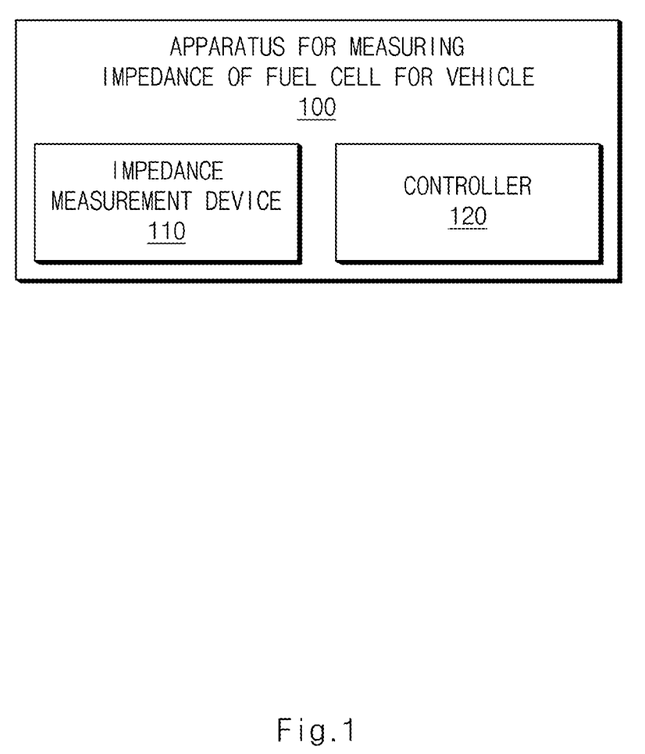
FIG. 1 is a block diagram illustrating an apparatus for measuring an impedance of a fuel cell for a vehicle according to an embodiment of the present disclosure.

FIG. 1 is a block diagram illustrating an apparatus for measuring an impedance of a fuel cell for a vehicle according to an embodiment of the present disclosure.

Referring to FIG. 1, an apparatus 100 for measuring an impedance of a fuel cell for a vehicle may include an impedance measurement device 110 and a controller 120.

The apparatus 100 for measuring an impedance of a fuel cell for a vehicle according to an embodiment may be implemented inside or outside the vehicle. In this case, the apparatus 100 for measuring an impedance of a fuel cell for a vehicle may be integrally formed with internal control devices, or may be implemented as a separate hardware device and connected to the control devices of the vehicle by a connection device.

For example, the apparatus 100 for measuring an impedance of a fuel cell for a vehicle may be implemented integrally with the vehicle, may be implemented in a manner that is installed/attached to the vehicle as a configuration separate from the vehicle, or some may be integrated with the vehicle and other parts may be implemented in a form that is installed/attached to the vehicle as a configuration separate from the vehicle.

The impedance measurement device 110 may be provided in a fuel cell system including a DC-DC converter for controlling voltages of a high voltage terminal which is connected to at least one of a motor or a peripheral device (Balance of Plant: BOP) of a vehicle and a low voltage terminal which is connected to the fuel cell stack, and may measure an impedance of the output terminal of the fuel cell stack.

For example, the impedance measurement device 110 is connected to the output terminal of the fuel cell stack, and may measure the impedance for each frequency band when the current or voltage of the output terminal of the fuel cell stack is stabilized in a normal state.

As an example, the impedance measurement device 110 may be directly or indirectly connected to the controller 120 through wireless or wired communication, and transmit information about the measured impedance to the controller 120.

In addition, the impedance measurement device 110 may be controlled by the controller 120, and may measure the impedance of the output terminal of the fuel cell stack according to a command transmitted from the controller 120.

A variable resistor may be connected to the low voltage terminal to consume current output from the fuel cell stack.

For example, the variable resistor may be connected to the low voltage terminal through a relay, such that the connection with the low voltage terminal may be controlled according to the operation of the relay.

The controller 120 may adjust the resistance value of the variable resistor.

In addition, the controller 120 may control the operation of the relay connecting the variable resistor and the low voltage terminal.

When an impedance measurement request is received, the controller 120 may measure, through the impedance measurement device 110, the impedance of the output terminal of the fuel cell stack in a state in which the output of the fuel cell stack is drawn and the impedance of the output terminal of the fuel cell stack in a state in which the drawing of the output of the fuel cell stack is stopped.

The controller 120 may perform overall control such that each component performs its function normally. The controller 120 may be implemented in the form of hardware, software, or a combination of hardware and software. Preferably, the controller 120 may be implemented as a microprocessor or a processor, but is not limited thereto. In addition, the controller 120 may perform various data processing and calculations, which will be described later.

For example, the controller 120 may identify the input of the impedance measurement request.

For example, the controller 120 may receive a request for impedance measurement of the fuel cell stack for a vehicle from a user through an input device (not shown).

For example, when an impedance measurement request is received, the controller 120 may measure the impedance of the output terminal of the fuel cell stack through the impedance measurement device 110 when the state of charge (SoC) of the vehicle battery exceeds a reference value.

When the SoC of the vehicle's battery does not exceed the reference value, because it is impossible to drive the BOP connected to the motor/high voltage terminal only with the battery, the controller 120 may determine whether the SoC of the vehicle's battery exceeds the reference value, and may measure the impedance of the output terminal of the fuel cell stack through the impedance measurement device 110 when the SoC of the vehicle's battery exceeds the reference value.

The controller 120 may calculate the impedance of the fuel cell stack based on the impedance of the output terminal of the fuel cell stack measured in a state in which the output of the fuel cell stack is drawn and the impedance of the output terminal of the fuel cell stack measured in the state in which the output of the fuel cell stack is stopped.

Because the impedance of the output terminal of the fuel cell stack measured in the state in which the output of the fuel cell stack is drawn is a value including the impedances of other components such as a converter, an air compressor (ACP), a cooling pump, and the like in addition to the impedance of the fuel cell stack, and the impedance of the output terminal of the fuel cell stack measured in the state in which the drawing of the output of the fuel cell stack is stopped is a value obtained by measuring the impedances of components other than the fuel cell stack, the controller 120 may calculate an accurate impedance value of only the fuel cell stack excluding other components, based on the two impedance values.

A process of calculating the impedance of the fuel cell stack by the controller 120 will be described in detail later with reference to FIG. 6.

For example, after applying a minute AC signal for each frequency band to the low voltage terminal, the controller 120 may check the amplitude and phase difference of a response signal to measure the impedance of the output terminal of the fuel cell stack through the impedance measurement device 110.

For example, after applying a minute AC signal for each frequency band at an operating point in a steady state where a constant current or a constant voltage is maintained, the controller 120 may identify the amplitude and phase difference of the response signal to measure the impedance of the output terminal of the fuel cell stack through the impedance measurement device 110.

For example, the controller 120 may control the supply of air to the fuel cell stack to draw or stop drawing the output of the fuel cell stack.

For example, the controller 120 may control the on/off of an air cut-off valve (ACV) to adjust the supply of air to the fuel cell stack.

When the controller 120 stops the supply of air to the fuel cell stack, the drawing of the output of the fuel cell stack may be stopped, and when the supply of air to the fuel cell stack is maintained, the output is drawn from the fuel cell stack.

For example, when an impedance measurement request is received, the controller 120 may control the DC-DC converter in a buck mode, and measure the impedance of the output terminal of the fuel cell stack through the impedance measurement device 110.

For example, the controller 120 may control the DC-DC converter in the buck mode to prevent current generated in the fuel cell stack from flowing to the high voltage terminal through the DC-DC converter.

In this case, the BOP connected to the high voltage terminal may be powered by a battery.

For example, the controller 120 may set the voltage of the low voltage terminal that is controlled to be constant in the state in which the output of the fuel cell stack is drawn and in the state in which the drawing of the output of the fuel cell stack is stopped.

For example, in the process of measuring the impedance of the output terminal of the fuel cell stack in the state in which the output of the fuel cell stack is drawn and in the state in which the drawing of the output of the fuel cell stack is stopped, the controller 120 may constantly maintain the voltage of the low voltage terminal based on the set voltage of the low voltage terminal.

For example, when the power of the fuel cell stack is required to drive at least one of the motor or peripheral devices of the vehicle, the controller 120 may control the DC-DC converter in the boost mode, and stop measuring the impedance of the output terminal of the fuel cell stack.

For example, when the power of the fuel cell stack is required to drive at least one of the motor or peripheral devices of the vehicle, the controller 120 may control the DC-DC converter in the boost mode, and may control the current generated in the fuel cell stack to flow to the high voltage terminal through the DC-DC converter.

In this case, the BOP connected to the high voltage terminal may receive power from the battery and the fuel cell.

For example, after adjusting the variable resistor connected to the low voltage terminal so that the power consumed by the variable resistor is greater than the power output from the fuel cell stack, the controller 120 may measure, through the impedance measurement device 110, the impedance of the output terminal of the fuel cell stack in the state in which the output of the stack is drawn.

For example, the controller 120 may control the relay that adjusts the resistance value of the variable resistor connected to the low voltage terminal.

For example, the controller 120 may control the variable resistor connected to the low voltage terminal such that the power higher than the power output from the fuel cell stack calculated based on the voltage of the low voltage terminal and the current output from the fuel cell stack is consumed in the variable resistor.

For example, when the voltage of the low voltage terminal is set to 380 V and the current output from the fuel cell stack is expected to be 20 A, the power of 380*20=7.6 kW may be output from the fuel cell stack.

In this case, the controller 120 may adjust the value of the variable resistor connected to the low voltage terminal so that the power consumed by the variable resistor is greater than 7.6 kW.

For example, the controller 120 may calculate the power output from the DC-DC converter by subtracting the power output from the fuel cell stack from the power consumed by the variable resistor in the state in which the output of the fuel cell stack is drawn.

For example, when the voltage of the low voltage terminal is set to 380 V, the power consumed by the variable resistor is set to 10 kW, and the current from the fuel cell stack is measured as 22 A, the controller 120 may calculate that 380*22=8.36 kW of power is withdrawn, and 1.64 kW of power obtained by subtracting 8.36 kW from 10 kW is output from the DC-DC converter.

For example, the controller 120 may measure the impedance of the output terminal of the fuel cell stack through the impedance measurement device 110 after adjusting the variable resistor such that the power output from the DC-DC converter in the state in which the drawing of the output of the fuel cell stack is stopped is the same as the power output from the DC-DC converter calculated in the state in which the output of the fuel cell stack is drawn.

For example, in the process of measuring the impedance of the output terminal of the fuel cell stack in the state in which the drawing of the output of the fuel cell stack is stopped after completing the measurement of the impedance of the output terminal of the fuel cell stack in the state in which the output of the fuel cell stack is drawn in order to maintain the electrical states of other systems except for the fuel cell stack as constant as possible, the controller 120 may control the relay to adjust the variable resistor such that the power output from the DC-DC converter is the same in both situations.

For example, the controller 120 may calculate the resistance value of the variable resistor to make the power output from the DC-DC converter equal to the power output from the DC-DC converter calculated in the state in which the output of the fuel cell stack is drawn, adjust the variable resistor, and drive a relay connecting the low voltage terminal and the variable resistor to connect the low voltage terminal and the variable resistor.

For example, the controller 120 may maintain the same control state of peripheral devices in the state in which the output of the fuel cell stack is drawn and in the state in which the drawing of the output of the fuel cell stack is stopped, and measure the impedance through the impedance measurement device 110.

For example, the controller 120 may store the RPM of the air compressor or the RPM of the cooling pump in a memory in the state in which the output of the fuel cell stack is drawn, and may measure the impedance through the impedance measurement device 110 while maintaining the RPM of the air compressor or the RPM of the cooling pump at the same value previously stored in the state in which the drawing of the output of the fuel cell stack is stopped.

For example, the controller 120 may change the voltage of the low voltage terminal to one or more values within a range in which the variable resistor connected to the low voltage terminal consumes the power output from the fuel cell stack, and measure the impedance through the impedance measurement device 110.

For example, the controller 120 may measure the impedance through the impedance measurement device 110 in various voltage ranges that are determined according to the resistance value of the variable resistor connected to the low voltage terminal and included in a range in which the variable resistor consumes all of the power output from the fuel cell stack.

A process of measuring, by the controller 120, the impedance through the impedance measurement device 110 in various voltage ranges will be described later in more detail with reference to FIG. 5.

For example, the controller 120 may control the voltage of the low voltage terminal to be the same in the state in which the output of the fuel cell stack is drawn and in the state in which the drawing of the output of the fuel cell stack is stopped, and measure the impedance through the impedance measurement device 110.

For example, the controller 120 may control the voltage of the low voltage terminal even in the state in which the drawing of the output of the fuel cell stack is stopped to be the same as in the state in which the output of the fuel cell stack is drawn, so that the electrical states of other systems are identically maintained.

For example, the controller 120 may store information on the voltage of the low voltage terminal in a memory in the state in which the output of the fuel cell stack is drawn, and control the voltage of the low voltage terminal to be equal to the voltage stored in the memory in the state in which the drawing of the output of the fuel cell stack is stopped.

Figure 2:
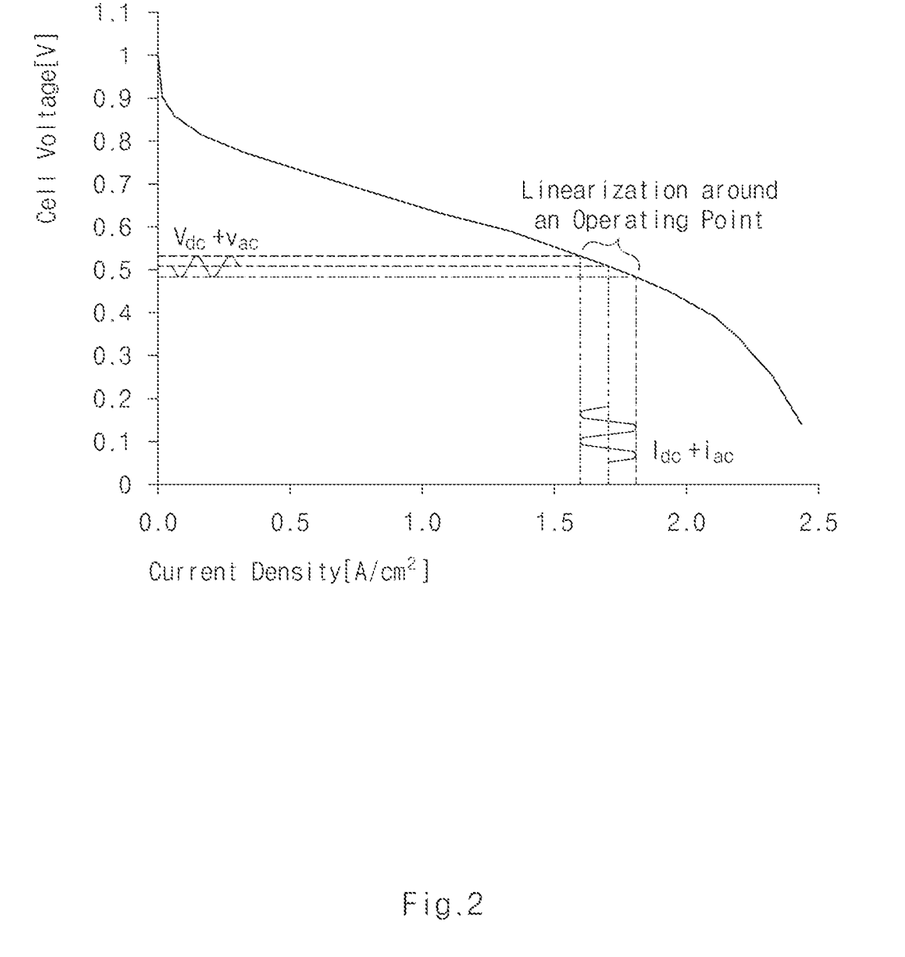
FIG. 2 is a graph illustrating that an apparatus for measuring an impedance of a fuel cell for a vehicle according to an embodiment of the present disclosure measures the impedance of the fuel cell by applying a minute AC signal.

FIG. 2 is a graph illustrating that an apparatus for measuring an impedance of a fuel cell for a vehicle according to an embodiment of the present disclosure measures the impedance of the fuel cell by applying a minute AC signal.

The apparatus 100 for measuring an impedance of a fuel cell for a vehicle may measure the impedance of the fuel cell stack under a specified condition in which the output current or the output voltage of the voltage terminal of the fuel cell stack is maintained in a constant current or constant voltage state.

Referring to FIG. 2, when the output current or output voltage of the voltage terminal of the fuel cell stack is maintained in the constant current or constant voltage state, the AC signal in the minute current or voltage range according to the frequency may be applied to the voltage terminal of the fuel cell stack.

In this case, the relationship between the minute AC current and the minute AC voltage having very small amplitudes may have a linear relationship.

Accordingly, the apparatus 100 for measuring an impedance of a fuel cell for a vehicle may measure the minute AC current and minute AC voltage that change according to the AC signal, and measure the impedance of the voltage terminal of the fuel cell stack based on the relationship between the minute AC current and the minute AC voltage.

The apparatus 100 for measuring an impedance of a fuel cell for a vehicle may measure the amplitude and phase difference of the response signal according to the minute AC signal for each frequency band, and may use the amplitude and phase difference of the response signal measured for an analysis process through Nyquist plot.

Figure 3:
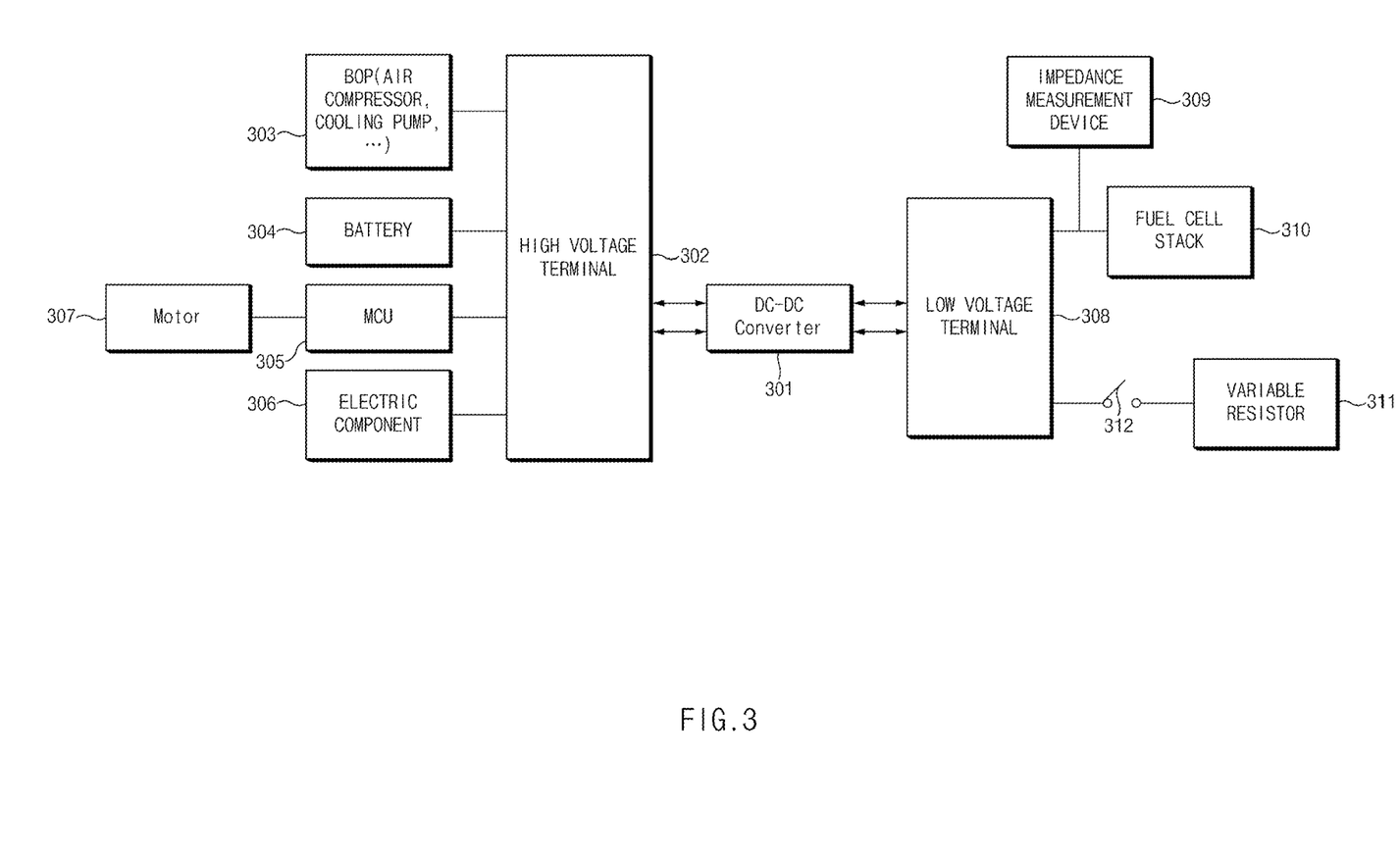
FIG. 3 is a block diagram illustrating a fuel cell system for a vehicle according to another embodiment of the present disclosure.

FIG. 3 is a block diagram illustrating a fuel cell system for a vehicle according to another embodiment of the present disclosure.

Referring to FIG. 3, a fuel cell system for a vehicle includes a DC-DC converter 301, a high voltage terminal 302, a BOP 303, a battery 304, a motor control unit (MCU) 305, an electric component 306, a motor 307, a low voltage terminal 308, an impedance measurement device 309, a fuel cell stack 310, a variable resistor 311, and a variable resistor relay 312.

The DC-DC converter 301 may be connected between the high voltage terminal 302 and the low voltage terminal 308 to convert a DC signal into a DC signal.

The DC-DC converter 301 may output a voltage lower or higher than an input voltage in the buck mode or the boost mode.

The high voltage terminal 302 may include a junction box (J/BOX) of the high voltage terminal connected to the DC-DC converter 301.

The high voltage terminal 302 may be connected to the BOP 303, the electric component 306 and the motor 307 for power sharing with vehicle components.

Preferably, the high voltage terminal 302 may be maintained at a voltage of 500 V to 700 V, but the embodiment is not necessarily limited thereto.

The BOP 303 may include peripheral devices for operating the fuel cell, and may include a fuel supply device, an air supply device, a humidity and water control device, and a heat treatment device.

In particular, the BOP 303 may include an air compressor and a cooling pump, and the like.

The battery 304 may provide power to the high voltage terminal 302 and may be charged separately.

The MCU 305 may include a processor for controlling the motor 307.

The electric component 306 may include various components operated by electricity in a vehicle system.

The motor 307 may drive the vehicle by generating power by electricity.

The low voltage terminal 308 may include the J/BOX of the low voltage terminal connected to the DC-DC converter 301.

The low voltage terminal 308 may be connected to the fuel cell stack 310 to receive power.

In addition, the low voltage terminal 308 may be connected to the variable resistor 311 through the variable resistor relay 312.

Preferably, the low voltage terminal 308 may be maintained at a voltage of 0 V to 420 V, but the embodiment is not necessarily limited thereto.

The impedance measurement device 309 may include the impedance measurement device 110 described in FIG. 1.

In the fuel cell system for a vehicle including the BOP 303, the DC-DC converter 301 and the fuel cell stack 310, the apparatus 100 for measuring an impedance of a fuel cell for a vehicle may measure the impedance in a state in which the output of the fuel cell stack 310 is drawn and in a state in which the output of the fuel cell stack 310 is not drawn, and may inversely calculate the intrinsic impedance of the fuel cell stack 310 by using information on the two measured impedances.

Figure 4:
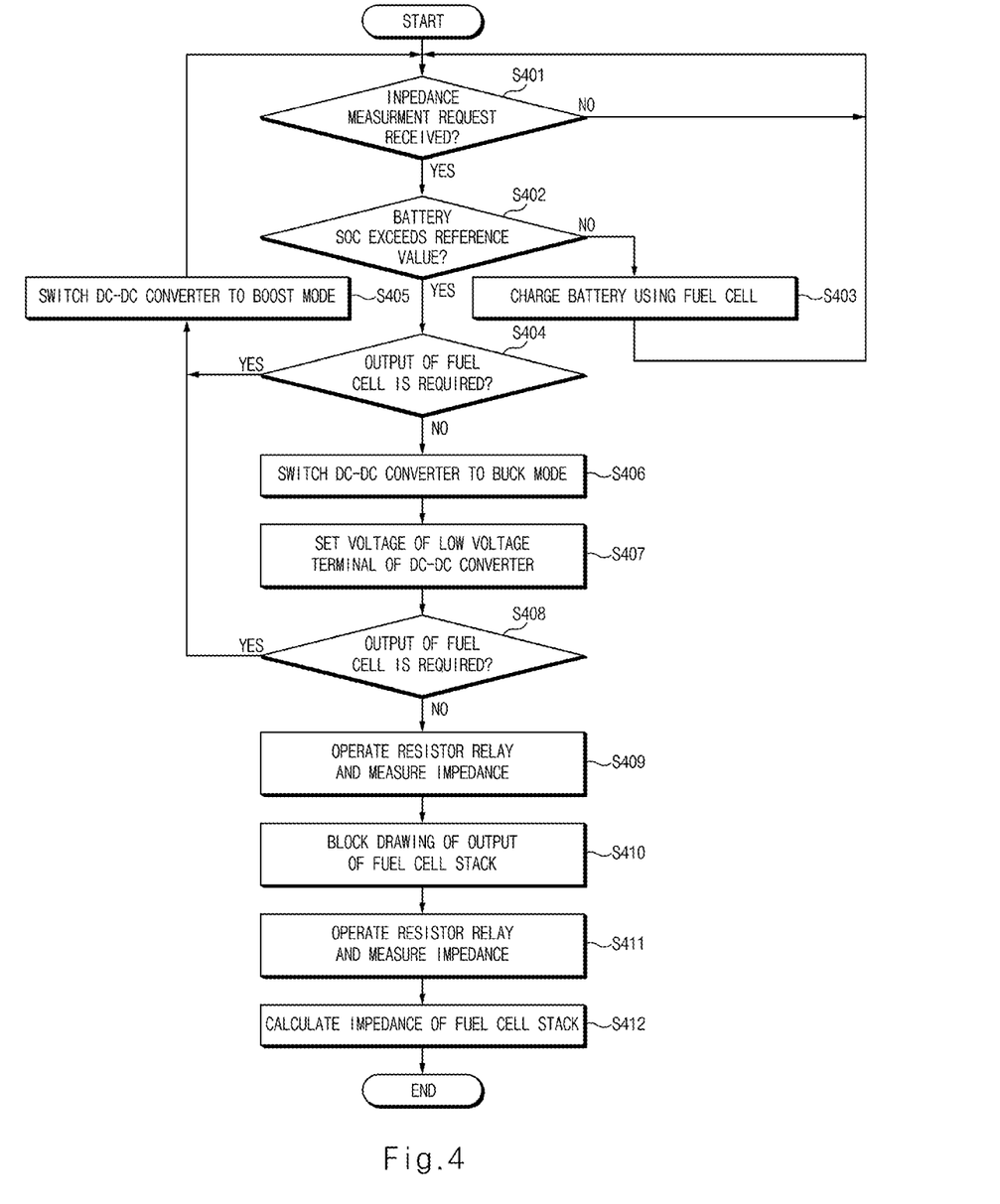
FIG. 4 is a flowchart illustrating a process of measuring an impedance by an apparatus for measuring an impedance of a fuel cell for a vehicle according to an embodiment of the present disclosure.

FIG. 4 is a flowchart illustrating a process of measuring an impedance by an apparatus for measuring an impedance of a fuel cell for a vehicle according to an embodiment of the present disclosure.

Hereinafter, it is assumed that the apparatus 100 for measuring an impedance of a fuel cell for a vehicle of FIG. 1 performs the process of FIG. 4. In addition, in the description of FIG. 4, the operation described as being performed by an apparatus may be understood as being controlled or performed by the controller 120 of the apparatus 100 for measuring an impedance of a fuel cell for a vehicle.

Referring to FIG. 4, the apparatus 100 for measuring an impedance of a fuel cell for a vehicle may receive an impedance measurement request in S401.

For example, the apparatus 100 for measuring an impedance of a fuel cell for a vehicle may receive an impedance measurement request from the vehicle system.

In S402, the apparatus 100 for measuring an impedance of a fuel cell for a vehicle may determine whether the SoC of the battery exceeds a reference value after receiving the impedance measurement request in S401.

For example, the apparatus 100 for measuring an impedance of a fuel cell for a vehicle may obtain the SoC of the battery through the battery management system (BMS) of the vehicle, and determine whether the SoC of the battery exceeds a preset reference value.

After determining whether the SoC of the battery exceeds the reference value in S402, in S403, the apparatus 100 for measuring an impedance of a fuel cell for a vehicle may charge the battery by using the fuel cell when it is determined that the SoC of the battery does not exceed the reference value.

For example, the apparatus 100 for measuring an impedance of a fuel cell for a vehicle may charge the battery by using the fuel cell to such an extent that the SoC of the battery exceeds the reference value in order to drive the BOP through only the battery.

The apparatus 100 for measuring an impedance of a fuel cell for a vehicle may return to S401 and receive an impedance measurement request after charging the battery using the fuel cell in S403.

After determining whether the SoC of the battery exceeds the reference value in S402, when it is determined that the SoC of the battery exceeds the reference value, in S404, the apparatus 100 for measuring an impedance of a fuel cell for a vehicle may determine whether the output of the fuel cell is required.

For example, the apparatus 100 for measuring an impedance of a fuel cell for a vehicle may determine whether excessive current is required in the vehicle system, such as a situation in which the vehicle cannot be driven only by the output of the battery during the impedance measurement process.

After determining in S404 that the output of the fuel cell is required, in S405, the apparatus 100 for measuring an impedance of a fuel cell for a vehicle may switch the DC-DC converter into the boost mode.

For example, the apparatus 100 for measuring an impedance of a fuel cell for a vehicle switches the DC-DC converter into the boost mode during the entire process of measuring an impedance in S405, and then again returns to S401 to receive an impedance measurement request.

After determining in S404 that the output of the fuel cell is not required, in S406, the apparatus 100 for measuring an impedance of a fuel cell for a vehicle may switch the DC-DC converter to the buck mode.

For example, the apparatus 100 for measuring an impedance of a fuel cell for a vehicle may switch the DC-DC converter to the buck mode, and control the current generated in the fuel cell stack not to flow to the high voltage terminal through the DC-DC converter, so that the BOP connected to the high voltage terminal may be driven through the power of the battery.

After switching the DC-DC converter to the buck mode in S406, the apparatus 100 for measuring an impedance of a fuel cell for a vehicle may set the voltage of the low voltage terminal of the DC-DC converter in S407.

For example, the apparatus 100 for measuring an impedance of a fuel cell for a vehicle may set the voltage of the low voltage terminal of the DC-DC converter to a value within a range in which the variable resistor connected to the low voltage terminal may consume all of the power output from the fuel cell stack.

As an example, the apparatus 100 for measuring an impedance of a fuel cell for a vehicle may measure the impedance while changing the voltage of the low voltage terminal to a value within a range in which the variable resistor connected to the low voltage terminal can consume all the power output from the fuel cell stack.

In S408, the apparatus 100 for measuring an impedance of a fuel cell for a vehicle may determine whether the output of the fuel cell is required after setting the voltage of the low voltage terminal of the DC-DC converter in S407.

For example, the apparatus 100 for measuring an impedance of a fuel cell for a vehicle may determine whether excessive current is required in the vehicle system, such as a situation in which the vehicle cannot be driven only by the output of the battery.

After determining that the output of the fuel cell is required in S408, in S405, the apparatus 100 for measuring an impedance of a fuel cell for a vehicle may switch the DC-DC converter to the boost mode.

For example, when it is determined that the output of the fuel cell is required, the apparatus 100 for measuring an impedance of a fuel cell for a vehicle may switch the DC-DC converter to the boost mode such that the output of the fuel cell stack is controlled to be used to drive the vehicle, and the like.

After determining that the output of the fuel cell is not required in S408, in S409, the apparatus 100 for measuring an impedance of a fuel cell for a vehicle may operate the resistor relay and measure the impedance of the output terminal of the fuel cell stack.

For example, the apparatus 100 for measuring an impedance of a fuel cell for a vehicle may operate the resistor relay to adjust the variable resistor connected to the low voltage terminal such that power consumed by the variable resistor is greater than the power output from the fuel cell stack.

For example, the apparatus 100 for measuring an impedance of a fuel cell for a vehicle may measure the impedance of the output terminal of the fuel cell stack for each frequency band when the current is stabilized.

In this case, the apparatus 100 for measuring an impedance of a fuel cell for a vehicle may preferably measure the impedances in various frequency bands of 1 Hz to 10 kHz, but the embodiment is not necessarily limited thereto.

For example, the apparatus 100 for measuring an impedance of a fuel cell for a vehicle may store the voltage of the low voltage terminal, the state of BOP components (air compressor RPM, cooling pump RPM, and the like), the current of the fuel cell stack, the current of the DC-DC converter at the time of measuring the impedance of the output terminal of the fuel cell stack in a memory.

After operating the resistor relay and measuring the impedance of the output terminal of the fuel cell stack in S409, in S410, the apparatus 100 for measuring an impedance of a fuel cell for a vehicle may block the drawing of the output of the fuel cell stack.

For example, the apparatus 100 for measuring an impedance of a fuel cell for a vehicle may block the air flowing into the fuel cell stack, thereby blocking the output of the fuel cell stack.

After blocking the drawing of the output of the fuel cell stack in S410, in S411, the apparatus 100 for measuring an impedance of a fuel cell for a vehicle may operate the resistor relay, and measure the impedance of the output terminal of the fuel cell stack.

As an example, when the output of the fuel cell stack is drawn, in S411, the apparatus 100 for measuring an impedance of a fuel cell for a vehicle may measure the impedance of the output terminal of the fuel cell stack while maintaining the states of other components in the same state as possible through the voltage of the low voltage terminal, the states of the BOP components (air compressor RPM, cooling pump RPM, and the like), the current of the fuel cell stack, and the current of the DC-DC converter, which are previously stored.

For example, the apparatus 100 for measuring an impedance of a fuel cell for a vehicle may drive the relay to control the variable resistance value such that the voltage of the low voltage terminal and the current of the DC-DC converter are kept the same.

After operating the resistor relay and measuring the impedance of the output terminal of the fuel cell stack in S411, the apparatus 100 for measuring an impedance of a fuel cell for a vehicle may calculate the impedance of the fuel cell stack in S412.

A process of calculating the impedance of the fuel cell stack by the apparatus 100 for measuring an impedance of a fuel cell for a vehicle will be described in detail later with reference to FIG. 6.

Figure 5:
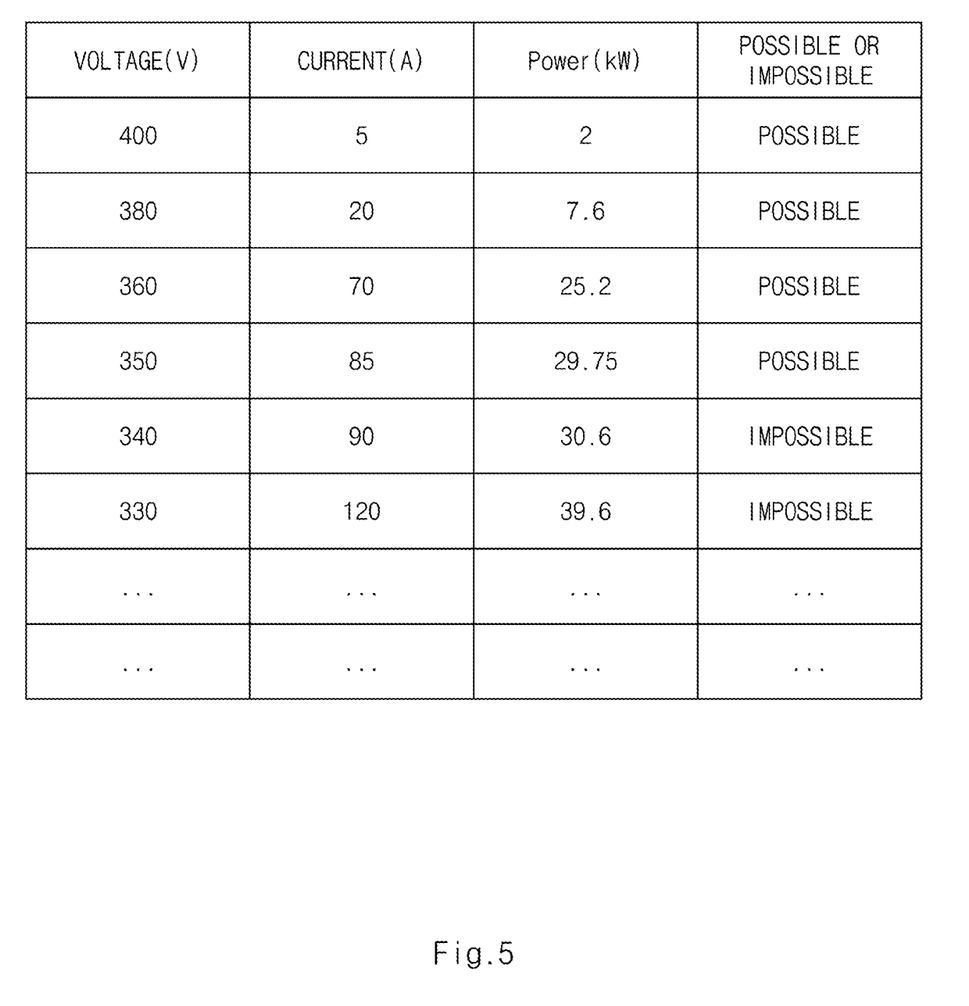
FIG. 5 is a table illustrating that an apparatus for measuring an impedance of a fuel cell for a vehicle according to an embodiment of the present disclosure adjusts the voltage of the low voltage terminal.

FIG. 5 is a table illustrating that an apparatus for measuring an impedance of a fuel cell for a vehicle according to an embodiment of the present disclosure adjusts the voltage of the low voltage terminal.

The apparatus 100 for measuring an impedance of a fuel cell for a vehicle may perform the measurement of the impedance while changing the voltage of the low voltage terminal to various values within a range in which the variable resistor connected to the low voltage terminal can consume all the power output from the fuel cell stack.

In the case of the example illustrated in FIG. 5, it may be assumed that the maximum range in which the variable resistor connected to the low voltage terminal of the fuel cell can consume the output of the stack is 30 kW.

For example, when the voltage of the low voltage terminal is 400 V, the current of the fuel cell stack may be 5 A, the power output from the fuel cell stack may be 2 kW, and all the power output from the fuel cell stack may be consumed by the variable connected to the low voltage terminal, so that it is possible to set the voltage of the low voltage terminal to 400 V.

For example, when the voltage of the low voltage terminal is 380 V, the current of the fuel cell stack may be 20 A, the power output from the fuel cell stack may be 7.6 kW, and all the power output from the fuel cell stack may be consumed by the variable resistor connected to the low voltage terminal, so that it is possible to set the voltage of the low voltage terminal to 380 V.

For example, when the voltage of the low voltage terminal is 360 V, the current of the fuel cell stack may be 70 A, the power output from the fuel cell stack may be 25.2 kW, and all the power output from the fuel cell stack may be consumed by the variable resistor connected to the low voltage terminal, so that it is possible to set the voltage of the low voltage terminal to 360 V.

For example, when the voltage of the low voltage terminal is 350 V, the current of the fuel cell stack may be 85 A, the power output from the fuel cell stack may be 29.75 kW, and all the power output from the fuel cell stack may be consumed by the variable resistor connected to the low voltage terminal, so that it is possible to set the voltage of the low voltage terminal to 350 V.

For example, when the voltage of the low voltage terminal is 340 V, the current of the fuel cell stack may be 90 A, the power output from the fuel cell stack may be 30.6 kW, and the power output from the fuel cell stack may not be completely consumed by the variable resistor connected to the low voltage terminal, so that it is impossible to set the voltage of the low voltage terminal to 340 V.

For example, when the voltage of the low voltage terminal is 330 V, the current of the fuel cell stack may be 120 A, the power output from the fuel cell stack may be 39.6 kW, and the power output from the fuel cell stack may not be completely consumed by the variable resistor connected to the low voltage terminal, so that it is impossible to set the voltage of the low voltage terminal to 340 V.

As the range in which the variable resistor can dissipate the power increases, it may be possible to measure the impedance up to the high current region of the fuel cell stack.

Figure 6:
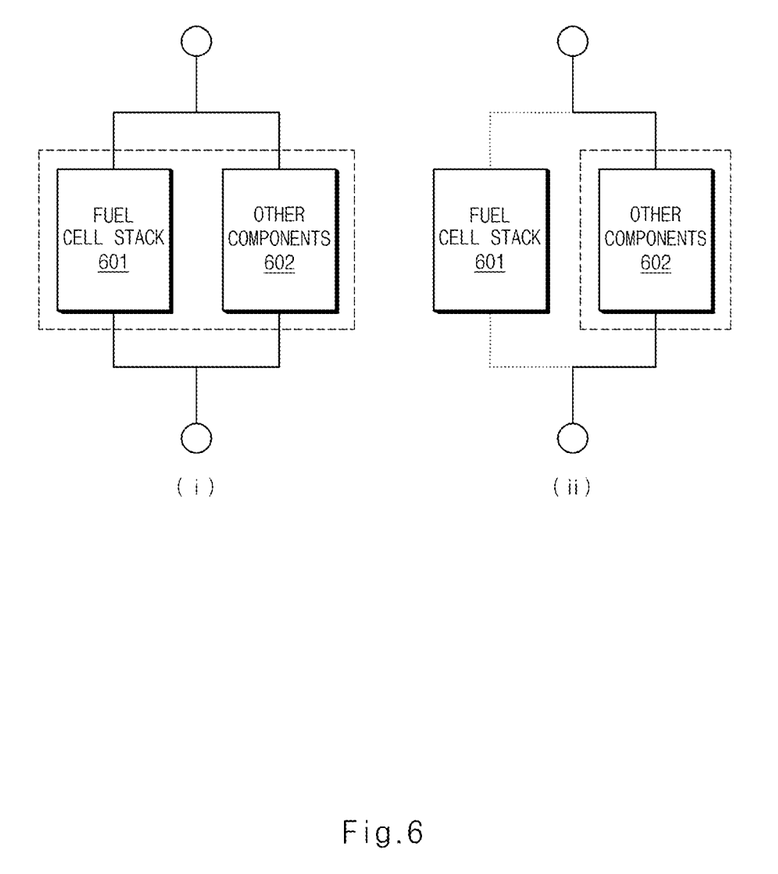
FIG. 6 is a diagram illustrating that an apparatus for measuring an impedance of a fuel cell for a vehicle according to an embodiment of the present disclosure calculates the impedance of the fuel cell stack.

FIG. 6 is a diagram illustrating that an apparatus for measuring an impedance of a fuel cell for a vehicle according to an embodiment of the present disclosure calculates the impedance of the fuel cell stack.

(i) of FIG. 6 is a diagram illustrating a state in which the output of the fuel cell stack is drawn.

When the apparatus 100 for measuring an impedance of a fuel cell for a vehicle measures the impedance of the impedance output terminal in the state in which the output of a fuel cell stack 601 is drawn, the impedance value of the fuel cell stack 601 and other components 602 including the BOP which are connected in parallel with each other may be measured.

(ii) of FIG. 6 is a diagram illustrating a state in which the drawing of the output of the fuel cell stack is stopped.

When the apparatus 100 for measuring an impedance of a fuel cell for a vehicle measures the impedance of the impedance output terminal in the state in which the drawing of the output of the fuel cell stack 601 is stopped, the impedance value of only the other components 602 including the BOP may be measured.

When the impedance of the impedance output terminal measured by the apparatus 100 for measuring an impedance of a fuel cell for a vehicle in the state in which the drawing of the output of the fuel cell stack 601 is drawn is $Z_1+jZ_2$, the impedance of the impedance output terminal measured by the apparatus 100 for measuring an impedance of a fuel cell for a vehicle in the state in which the drawing of the output of the fuel cell stack 601 is stopped is $Z_{e1}+jZ_{e2}$, and the impedance of only the fuel cell stack 601 is $Z_{s1}+jZ_{s2}$, the apparatus 100 for measuring an impedance of a fuel cell for a vehicle may calculate the impedance of only the fuel cell stack through following Equation 1 and Equation 2.

$$\frac{1}{Z_1+jZ_2} = \frac{1}{Z_{s1}+jZ_{s2}} + \frac{1}{Z_{e1}+jZ_{e2}} \quad \text{[Equation 1]}$$

$$\frac{1}{Z_{s1}+jZ_{s2}} = \frac{1}{Z_1+jZ_2} - \frac{1}{Z_{e1}+jZ_{e2}}$$

$$Z_{s1} = \frac{(Z_{e1}-Z_1)(Z_1Z_{e1}-Z_2Z_{e2})+}{(Z_{e2}-Z_2)(Z_1Z_{e2}+Z_2Z_{e1})} \quad \text{[Equation 2]}$$

$$Z_{s2} = \frac{(Z_{e1}-Z_1)(Z_1Z_{e2}-Z_2Z_{e1})-}{(Z_{e2}-Z_2)(Z_1Z_{e1}+Z_2Z_{e2})}$$
$$\frac{}{(Z_{e1}-Z_1)^2+(Z_{e2}-Z_2)^2}$$

Figure 7:
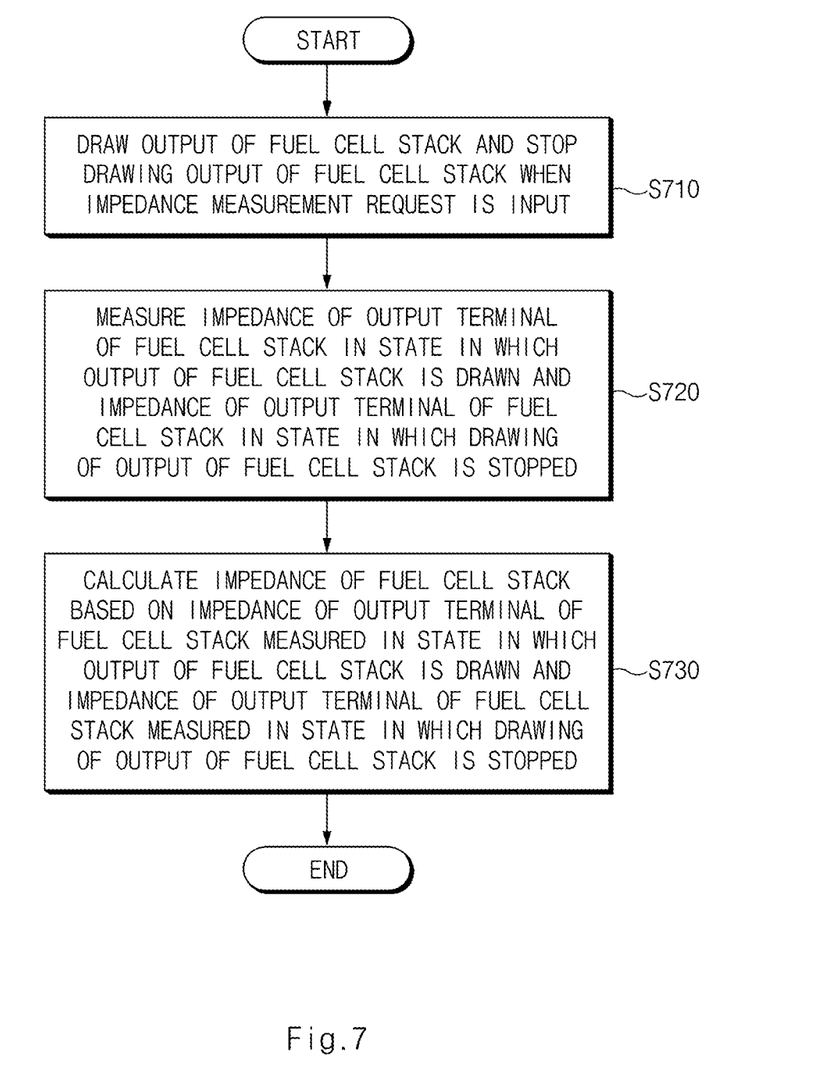
FIG. 7 is a flowchart illustrating a method of measuring an impedance of a fuel cell for a vehicle according to an embodiment of the present disclosure.

FIG. 7 is a flowchart illustrating a method of measuring an impedance of a fuel cell for a vehicle according to an embodiment of the present disclosure.

Referring to FIG. 7, a method of measuring an impedance of a fuel cell for a vehicle may include S710 of drawing the output of the fuel cell stack and stopping drawing the output of the fuel cell stack when an impedance measurement request is input, S720 of measuring the impedance of the output terminal of the fuel cell stack in the state in which the output of the fuel cell stack is drawn and the impedance of the output terminal of the fuel cell stack in the state in which the drawing of the output of the fuel cell stack is stopped, and S730 of calculating the impedance of the fuel cell stack based on the impedance of the output terminal of the fuel cell stack measured in the state in which the output of the fuel cell stack is drawn and the impedance of the output terminal of the fuel cell stack measured in the state in which the drawing of the output of the fuel cell stack is stopped.

S710 of drawing the output of the fuel cell stack and stopping drawing the output of the fuel cell stack when an impedance measurement request is input may be performed through the controller 120.

For example, S710 of drawing the output of the fuel cell stack and stopping drawing the output of the fuel cell stack when an impedance measurement request is input may include controlling, by the controller 120, an air shutoff valve to draw the output of the fuel cell stack and stop drawing the output of the fuel cell stack.

S720 of measuring the impedance of the output terminal of the fuel cell stack in the state in which the output of the fuel cell stack is drawn and the impedance of the output terminal of the fuel cell stack in the state in which the drawing of the output of the fuel cell stack is stopped may be performed through the impedance measurement device 110.

For example, S720 of measuring the impedance of the output terminal of the fuel cell stack in the state in which the output of the fuel cell stack is drawn and the impedance of the output terminal of the fuel cell stack in the state in which the drawing of the output of the fuel cell stack is stopped may include measuring the impedance of the output terminal of the fuel cell stack through the impedance measurement device when the impedance measurement request is input and the SoC of a battery of the vehicle exceeds a reference value.

For example, S720 of measuring the impedance of the output terminal of the fuel cell stack in the state in which the output of the fuel cell stack is drawn and the impedance of the output terminal of the fuel cell stack in the state in which the drawing of the output of the fuel cell stack is stopped may include controlling the DC-DC converter in a boost mode when power of the fuel cell stack is required to drive at least one of a motor of the vehicle or the peripheral device, and stopping measuring the impedance of the output terminal of the fuel cell stack.

For example, S720 of measuring the impedance of the output terminal of the fuel cell stack in the state in which the output of the fuel cell stack is drawn and the impedance of the output terminal of the fuel cell stack in the state in which the drawing of the output of the fuel cell stack is stopped may include measuring, through the impedance measurement device 110, the impedance of the output terminal of the fuel cell stack in the state in which the output of the stack is drawn after adjusting the variable resistor connected to the low voltage terminal so that the power consumed by the variable resistor is greater than the power output from the fuel cell stack, and calculating, by the controller, the power output from the DC-DC converter by subtracting the power output from the fuel cell stack from the power consumed by the variable resistor in the state in which the output of the fuel cell stack is drawn.

For example, S720 of measuring the impedance of the output terminal of the fuel cell stack in the state in which the output of the fuel cell stack is drawn and the impedance of the output terminal of the fuel cell stack in the state in which the drawing of the output of the fuel cell stack is stopped may further include measuring the impedance of the output terminal of the fuel cell stack through the impedance measurement device after adjusting the variable resistor such that the power output from the DC-DC converter in the state in which the drawing of the output of the fuel cell stack is stopped is the same as the power output from the DC-DC converter calculated in the state in which the output of the fuel cell stack is drawn.

For example, S720 of measuring the impedance of the output terminal of the fuel cell stack in the state in which the output of the fuel cell stack is drawn and the impedance of the output terminal of the fuel cell stack in the state in which the drawing of the output of the fuel cell stack is stopped may include equally maintaining the control state of the peripheral device, and measuring the impedance through the impedance measurement device in the state in which the output of the fuel cell stack is drawn and in the state in which the drawing of the output of the fuel cell stack is stopped.

For example, S720 of measuring the impedance of the output terminal of the fuel cell stack in the state in which the output of the fuel cell stack is drawn and the impedance of the output terminal of the fuel cell stack in the state in which the drawing of the output of the fuel cell stack is stopped may include changing the voltage of the low voltage terminal to one or more values within a range in which the variable resistor connected to the low voltage terminal consumes the power output from the fuel cell stack, and measuring the impedance through the impedance measurement device.

For example, S720 of measuring the impedance of the output terminal of the fuel cell stack in the state in which the output of the fuel cell stack is drawn and the impedance of the output terminal of the fuel cell stack in the state in which the drawing of the output of the fuel cell stack is stopped may include controlling the voltage of the low voltage terminal to be constant, and measuring the impedance through the impedance measurement device in the state in which the output of the fuel cell stack is drawn and in the state in which the drawing of the output of the fuel cell stack is stopped.

S730 of calculating the impedance of the fuel cell stack based on the impedance of the output terminal of the fuel cell stack measured in the state in which the output of the fuel cell stack is drawn and the impedance of the output terminal of the fuel cell stack measured in the state in which the drawing of the output of the fuel cell stack is stopped may be performed by the controller 120.

Accordingly, the processes of the method or algorithm described in relation to the embodiments of the present disclosure may be implemented by hardware executed by the processor, a software module, or a combination thereof. The software module may reside in a storage medium (that is, the memory and/or the storage), such as a RAM, a flash memory, a ROM, an EPROM, an EEPROM, a register, a hard disk, solid state drive (SSD), a detachable disk, or a CD-ROM.

The exemplary storage medium is coupled to the processor, and the processor may read information from the storage medium and may write information in the storage medium. In another method, the storage medium may be integrated with the processor. The processor and the storage medium may reside in an application specific integrated circuit (ASIC). The ASIC may reside in a user terminal. In another method, the processor and the storage medium may reside in the user terminal as an individual component.

The effect of the apparatus for measuring an impedance of a fuel cell for a vehicle according to the present disclosure will be described as follows.

According to at least one embodiment of the present disclosure, it is possible to provide an apparatus and method for measuring an impedance of a fuel cell in a system to which a DC-DC converter is applied.

In addition, according to at least one embodiment of the present disclosure, it is possible to provide an apparatus and method for measuring an impedance of a fuel cell for a vehicle which can accurately measure the impedance of only a stack by removing the impedance of other components from the measured impedance.

In addition, according to at least one embodiment of the present disclosure, it is possible to provide an apparatus and method for measuring an impedance of a fuel cell for a vehicle that can accurately measure the impedance of only a fuel cell stack to accurately identify and analyze the internal state of the fuel cell.

In addition, according to at least one embodiment of the present disclosure, it is possible to provide an apparatus and method for measuring an impedance of a fuel cell for a vehicle that can accurately measure the impedance of only a fuel cell stack even if there are other components (an air compressor, a cooling pump, and the like) in addition to the fuel cell stack.

In addition, according to at least one embodiment of the present disclosure, it is possible to provide an apparatus and method for measuring an impedance of a fuel cell for a vehicle that can accurately measure the impedance of a fuel cell stack in order to more accurately analyze the estimation of the quantity of the fuel cell stack, mass transfer loss characteristics, activation loss, and the like.

In addition, various effects that are directly or indirectly understood through the present disclosure may be provided.

Although exemplary embodiments of the present disclosure have been described for illustrative purposes, those skilled in the art will appreciate that various modifications, additions and substitutions are possible, without departing from the scope and spirit of the disclosure.

Therefore, the exemplary embodiments disclosed in the present disclosure are provided for the sake of descriptions, not limiting the technical concepts of the present disclosure, and it should be understood that such exemplary embodiments are not intended to limit the scope of the technical concepts of the present disclosure. The protection scope of the present disclosure should be understood by the claims below, and all the technical concepts within the equivalent scopes should be interpreted to be within the scope of the right of the present disclosure.

What is claimed is:

1. An apparatus for measuring an impedance of a fuel cell for a vehicle, the apparatus comprising:
   an impedance measurement device provided in a fuel cell system to measure an impedance of an output terminal of a fuel cell stack, wherein the fuel cell system includes a DC-DC converter configured to control voltages of a high voltage terminal which is connected to at least one of a motor or a peripheral device of the vehicle and a low voltage terminal which is connected to the fuel cell stack; and
   a controller configured to:
      draw an output of the fuel cell stack and stop drawing the output of the fuel cell stack when an impedance measurement request is received, wherein the controller is configured to measure the impedance of the output terminal of the fuel cell stack in a state in which the output of the fuel cell stack is drawn and measure the impedance of the output terminal of the fuel cell stack in a state in which the drawing of the output of the fuel cell stack is stopped, through the impedance measurement device, and
      calculate the impedance of the fuel cell stack based on the impedance of the output terminal of the fuel cell stack measured in the state in which the output of the fuel cell stack is drawn and the impedance of the output terminal of the fuel cell stack measured in the state in which the drawing of the output of the fuel cell stack is stopped,
   wherein the controller is configured to control the DC-DC converter in a buck mode and measure the impedance of the output terminal of the fuel cell stack through the impedance measurement device when the impedance measurement request is received.

2. The apparatus of claim 1, wherein the controller is configured to measure the impedance of the output terminal of the fuel cell stack by identifying an amplitude and a phase difference of a response signal through the impedance measurement device after applying a minute AC signal according to frequency to the low voltage terminal,
   wherein the maximum amplitude of AC voltage in the minute AC signal does not exceed 0.1V, and the maximum amplitude of AC current does not exceed 0.5 A/cm$^2$.

3. The apparatus of claim 1, wherein the controller is configured to measure the impedance of the output terminal of the fuel cell stack through the impedance measurement device when the impedance measurement request is received and a state of charge (SoC) of a battery of the vehicle exceeds a reference value.

4. The apparatus of claim 1, wherein the controller is configured to control supply of air to the fuel cell stack to draw the output of the fuel cell stack and stop drawing the output of the fuel cell stack.

5. The apparatus of claim 1, wherein the controller is configured to set the voltage of the low voltage terminal that is controlled to be constant in the state in which the output of the fuel cell stack is drawn and in the state in which the drawing of the output of the fuel cell stack is stopped.

6. The apparatus of claim 1, wherein the controller is configured to:
control the DC-DC converter in a boost mode when power of the fuel cell stack is required to drive at least one of the motor of the vehicle or the peripheral device, and
stop measuring the impedance of the output terminal of the fuel cell stack.

7. The apparatus of claim 1, wherein the controller is configured to measure the impedance of the output terminal of the fuel cell stack through the impedance measurement device in the state in which the output of the fuel cell stack is drawn after adjusting a variable resistor connected to the low voltage terminal such that power consumed by the variable resistor is greater than power output from the fuel cell stack.

8. The apparatus of claim 7, wherein the controller is configured to calculate power output from the DC-DC converter by subtracting power output from the fuel cell stack from the power consumed by the variable resistor in the state in which the output of the fuel cell stack is drawn.

9. The apparatus of claim 8, wherein the controller is configured to measure the impedance of the output terminal of the fuel cell stack through the impedance measurement device after adjusting the variable resistor such that the power output from the DC-DC converter is equal to the power output from the DC-DC converter calculated in the state in which the output of the fuel cell stack is drawn, in the state in which the drawing of the output of the fuel cell stack is stopped.

10. The apparatus of claim 9, wherein the controller is configured to:
adjust the variable resistor by calculating a resistance value of the variable resistor such that the power output from the DC-DC converter is equal to the power output from the DC-DC converter calculated in the state in which the output of the fuel cell stack is drawn, and
drive a relay, disposed between the low voltage terminal and the variable resistor, to connect the low voltage terminal and the variable resistor.

11. The apparatus of claim 1, wherein the controller is configured to maintain a control state of the peripheral device, and measure the impedance through the impedance measurement device in the state in which the output of the fuel cell stack is drawn and in the state in which the drawing of the output of the fuel cell stack is stopped.

12. The apparatus of claim 1, wherein the controller is configured to change the voltage of the low voltage terminal to one or more values within a range in which a variable resistor connected to the low voltage terminal consumes power output from the fuel cell stack, and measure the impedance through the impedance measurement device.

13. The apparatus of claim 1, wherein the controller is configured to control the voltage of the low voltage terminal to be constant, and measure the impedance through the impedance measurement device in the state in which the output of the fuel cell stack is drawn and in the state in which the drawing of the output of the fuel cell stack is stopped.

14. A method of measuring an impedance of a fuel cell for a vehicle, the method comprising:
drawing, by a controller, an output of a fuel cell stack and stopping drawing the output of the fuel cell stack when an impedance measurement request is received;
measuring, by the controller, an impedance of an output terminal of the fuel cell stack in a state in which the output of the fuel cell stack is drawn and measuring the impedance of the output terminal of the fuel cell stack in a state in which the drawing of the output of the fuel cell stack is stopped, through an impedance measurement device provided in a fuel cell system, wherein the fuel cell system includes a DC-DC converter configured to control voltages of a high voltage terminal which is connected to at least one of a motor and a peripheral device of the vehicle or a low voltage terminal which is connected to the fuel cell stack; and
calculating, by the controller, the impedance of the fuel cell stack based on the impedance of the output terminal of the fuel cell stack measured in the state in which the output of the fuel cell stack is drawn and the impedance of the output terminal of the fuel cell stack measured in the state in which the drawing of the output of the fuel cell stack is stopped,
wherein the measuring of the impedance by the controller includes: controlling, by the controller, the DC-DC converter in a buck mode and measuring, by the controller, the impedance of the output terminal of the fuel cell stack through the impedance measurement device when the impedance measurement request is received.

15. The method of claim 14, wherein the measuring of the impedance by the controller includes:
measuring, by the controller, the impedance of the output terminal of the fuel cell stack through the impedance measurement device when the impedance measurement request is received and a state of charge (SoC) of a battery of the vehicle exceeds a reference value.

16. The method of claim 14, wherein the measuring of the impedance by the controller includes:
controlling, by the controller, the DC-DC converter in a boost mode when power of the fuel cell stack is required to drive at least one of the motor of the vehicle or the peripheral device, and stopping measuring the impedance of the output terminal of the fuel cell stack.

17. The method of claim 14, wherein the measuring of the impedance by the controller includes:
maintaining a control state of the peripheral device, and measuring the impedance through the impedance measurement device in the state in which the output of the fuel cell stack is drawn and in the state in which the drawing of the output of the fuel cell stack is stopped.

18. The method of claim 14, wherein the measuring of the impedance by the controller includes:
changing, by the controller, the voltage of the low voltage terminal to one or more values within a range in which a variable resistor connected to the low voltage terminal consumes power output from the fuel cell stack, and measuring the impedance through the impedance measurement device.

19. The method of claim 14, wherein the measuring of the impedance by the controller includes:
controlling the voltage of the low voltage terminal to be constant, and measuring the impedance through the impedance measurement device in the state in which the output of the fuel cell stack is drawn and in the state in which the drawing of the output of the fuel cell stack is stopped.

20. An apparatus for measuring an impedance of a fuel cell for a vehicle, the apparatus comprising:
- an impedance measurement device provided in a fuel cell system to measure an impedance of an output terminal of a fuel cell stack, wherein the fuel cell system includes a DC-DC converter configured to control voltages of a high voltage terminal which is connected to at least one of a motor or a peripheral device of the vehicle and a low voltage terminal which is connected to the fuel cell stack; and
- a controller configured to:
  - draw an output of the fuel cell stack and stop drawing the output of the fuel cell stack when an impedance measurement request is received, wherein the controller is configured to measure the impedance of the output terminal of the fuel cell stack in a state in which the output of the fuel cell stack is drawn and measure the impedance of the output terminal of the fuel cell stack in a state in which the drawing of the output of the fuel cell stack is stopped, through the impedance measurement device, and
  - calculate the impedance of the fuel cell stack based on the impedance of the output terminal of the fuel cell stack measured in the state in which the output of the fuel cell stack is drawn and the impedance of the output terminal of the fuel cell stack measured in the state in which the drawing of the output of the fuel cell stack is stopped,
- wherein the controller is configured to measure the impedance of the output terminal of the fuel cell stack through the impedance measurement device in the state in which the output of the fuel cell stack is drawn after adjusting a variable resistor connected to the low voltage terminal such that power consumed by the variable resistor is greater than power output from the fuel cell stack.

\* \* \* \* \*